United States Patent
Brantley et al.

(10) Patent No.: US 9,837,973 B2
(45) Date of Patent: Dec. 5, 2017

(54) HIGH VOLTAGE INPUT CIRCUIT FOR A DIFFERENTIAL AMPLIFIER

(71) Applicant: TEXAS INSTRUMENTS INCORPORATED, Dallas, TX (US)

(72) Inventors: Steven Graham Brantley, Satellite Beach, FL (US); Vadim Valerievich Ivanov, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/950,643

(22) Filed: Jul. 25, 2013

(65) Prior Publication Data

US 2015/0028949 A1    Jan. 29, 2015

(51) Int. Cl.
*H03F 3/45*    (2006.01)

(52) U.S. Cl.
CPC .......... *H03F 3/45376* (2013.01); *H03F 2203/45568* (2013.01); *H03F 2203/45571* (2013.01)

(58) Field of Classification Search
CPC .......................................................... H03F 3/45
USPC ............................... 330/253, 261, 298, 207 P
See application file for complete search history.

(56) References Cited

U.S. PATENT DOCUMENTS 3,725,801 A * 4/1973 Beelitz .......................... 330/252
7,710,197 B2 * 5/2010 Aoki et al. .................... 330/252

* cited by examiner

*Primary Examiner* — Henry Choe
(74) *Attorney, Agent, or Firm* — Gregory J. Albin; Charles A. Brill; Frank D. Cimino

(57) ABSTRACT

A differential input circuit (FIG. 3A) is disclosed. The circuit includes a first input terminal (drain of 310) and a second input terminal (drain of 312). A first input transistor (310) has a first control terminal and has a current path coupled to the first input terminal. A second input transistor (312) has a second control terminal and has a current path coupled to the second input terminal. A third transistor (306) has a third control terminal and has a current path between a first differential input terminal (Vin+) and the first control terminal. A fourth transistor (308) has a fourth control terminal and has a current path between a second differential input terminal (Vin−) and the second control terminal.

20 Claims, 4 Drawing Sheets

HIGH VOLTAGE INPUT CIRCUIT FOR A DIFFERENTIAL AMPLIFIER

BACKGROUND OF THE INVENTION

Embodiments of the present invention relate to a high voltage input stage for a complementary metal oxide semiconductor (CMOS) differential amplifier.

High voltage differential amplifiers using relatively low voltage transistors require protection for differential input terminals to avoid gate oxide stress. Circuits of the prior art have typically used diode clamps to limit peak-to-peak voltage across differential input terminals. These diode clamps, however, conduct high currents under forward bias. Moreover, they increase input capacitance, may slow operation due to forward bias recovery time, and increase noise.

Referring to FIG. 1, there is a high voltage differential amplifier circuit of the prior art. Here, and in the following discussion the differential amplifier may be an operational amplifier or other balanced amplifier for amplifying difference signals. The circuit includes back-to-back diodes 102 and 104 connected between differential input terminals Vin+ and Vin−. The input terminals are connected directly to the gate terminals of low voltage p-channel input transistors 106 and 108. A common source terminal of p-channel transistors 106 and 108 is connected to current source 100. The drain terminals of p-channel transistors 106 and 108 are connected to negative and positive input terminals of differential amplifier 110, respectively. In operation, peak-to-peak voltage between input terminals Vin+ and Vin− is limited to a diode drop of approximately 0.7 V plus a voltage developed across the parasitic resistance of the forward biased diode. The circuit of FIG. 1, therefore, protects low voltage p-channel transistors 106 and 108 at the expense of high forward bias diode current, high capacitance, and additional noise.

Referring next to FIG. 2, there is another high voltage differential amplifier circuit of the prior art. This circuit includes p-channel switch transistors 202 and 204 and p-channel input transistors 206 and 208, having control gates coupled to respective input terminals Vin+ and Vin−. Current sources 200 are coupled to the respective common source terminals of the p-channel transistors. Drain terminals of p-channel transistors 206 and 208 are coupled to negative and positive input terminals of differential amplifier 210, respectively. In operation, when input terminal Vin− is held to 0 V, for example, p-channel transistors and 204 and 208 remain on. A high positive voltage applied to input terminal Vin+ turns off p-channel transistors 202 and 206. In this condition, the common source and bulk terminals of p-channel transistors 202 and 206 are driven high by current source 200. P-channel transistor 204 remains on and drives the common drain terminal of p-channel transistors 202 and 204 high. The drain terminal of p-channel transistor 206 is essentially floating. Thus, there is insufficient voltage across the gate oxide of p-channel transistors 202 and 206 to damage gate oxide. However, there are several disadvantages to this circuit. First, transconductance of the input terminals is reduced by resistance of p-channel switch transistors 202 and 204. This increases noise and offset voltage and decreases bandwidth of the differential amplifier.

While the preceding approaches protect low voltage input transistors, the present inventors recognize that still further improvements are possible. Accordingly, the preferred embodiments described below are directed toward improving upon the prior art.

BRIEF SUMMARY OF THE INVENTION

In a preferred embodiment of the present invention, a differential input circuit is disclosed. The circuit includes first and second input terminals. A first input transistor has a first control terminal and has a current path coupled to the first input terminal. A second input transistor has a second control terminal and has a current path coupled to the second input terminal. A third transistor has a third control terminal and has a current path between a first differential input terminal and the first control terminal. A fourth transistor has a fourth control terminal and has a current path between a second differential input terminal and the second control terminal.

DETAILED DESCRIPTION OF THE INVENTION

The preferred embodiments of the present invention provide significant advantages over differential input circuits of the prior art as will become evident from the following detailed description.

Figure 1:
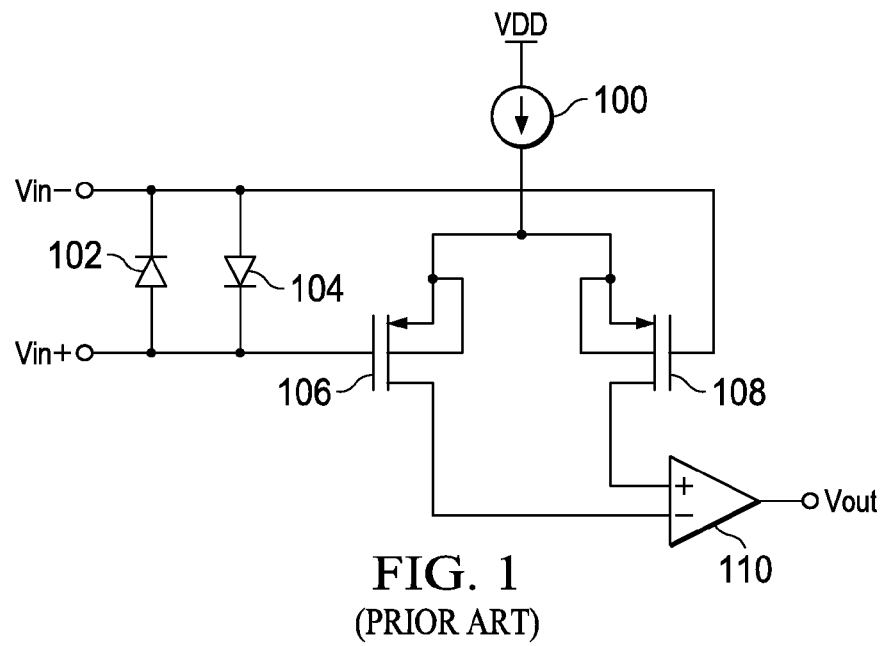
FIG. 1 is a circuit diagram of a high voltage differential amplifier circuit of the prior art.
Figure 2:
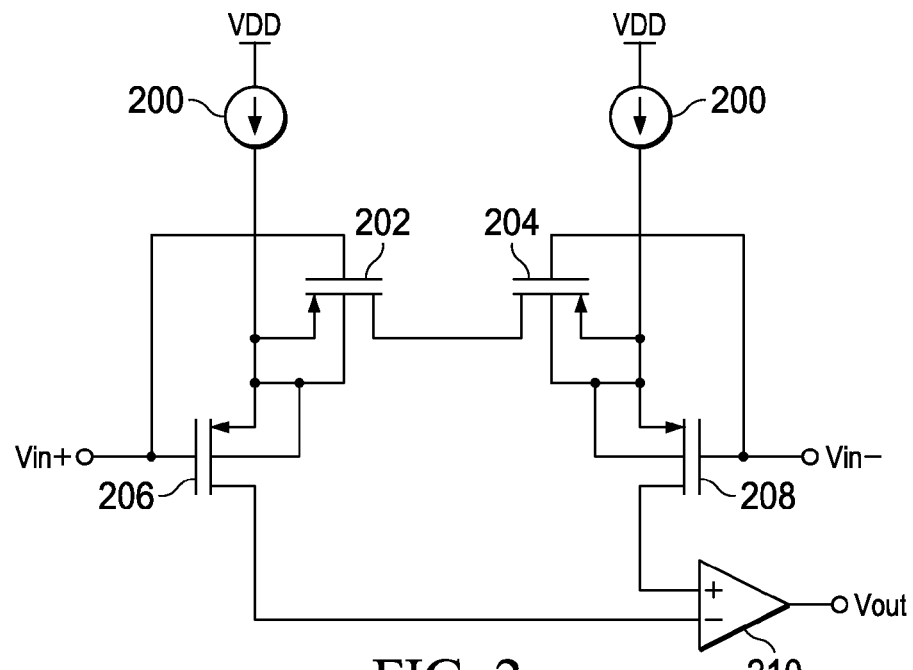
FIG. 2 is a circuit diagram of another high voltage differential amplifier circuit of the prior art.
Figure 3A:
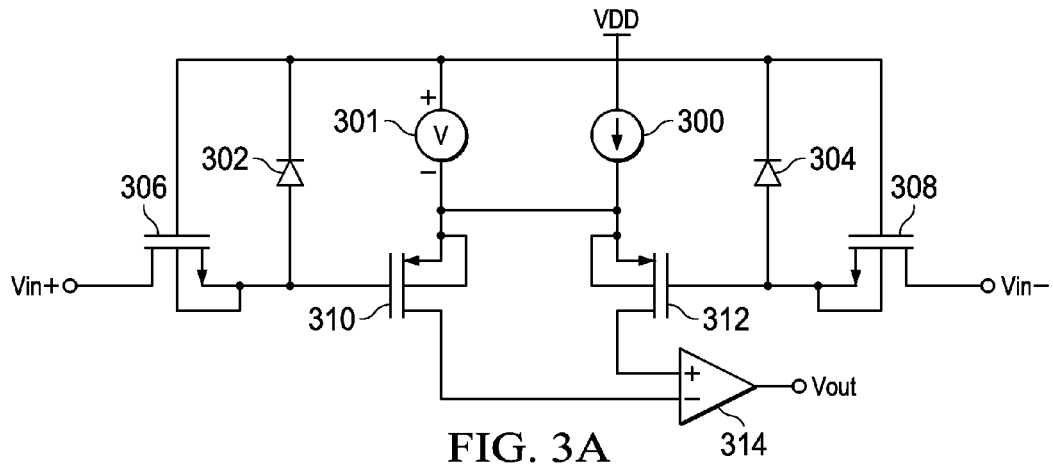
FIG. 3A is a circuit diagram of a first embodiment of a high voltage differential amplifier circuit of the present invention.

Referring to FIG. 3A, there is a circuit diagram of a first embodiment of a high voltage differential amplifier circuit of the present invention. Here and in the following discussion, the same reference numerals are used in the drawing figures to indicate substantially the same circuit elements. The circuit includes differential amplifier 314 having output terminal Vout. The differential amplifier may be an operational amplifier configured as a linear amplifier, integrator, or other special purpose amplifier as is known in the art. The differential amplifier 314 has first (−) and second (+) input terminals. A first p-channel input transistor 310 has a current path coupled to the first (−) input terminal. A second p-channel input transistor 312 has a current path coupled to the second (+) input terminal. The first and second input transistors are preferably balanced and have substantially the same threshold voltage and are oriented to compensate for any slight misalignment during fabrication. N-channel transistor 306 has a current path coupled between a first differential input terminal (Vin+) and a control terminal of the first input transistor 310. N-channel transistor 308 has a current path coupled between a second differential input terminal (Vin−) and a control terminal of the second input transistor 312. N-channel transistors 306 and 308 are preferably balanced, high voltage transistors. Here, high voltage means that the transistors can withstand a higher gate-to-drain voltage than input transistors 310 and 312. This is preferably accomplished by fabricating transistors 306 and 308 as drain extended n-channel transistors as is known in the art. Alternatively, n-channel transistors 306 and 308 may be fabricated with a thicker gate dielectric than transistors 310 and 312. A current source 300 is coupled between supply voltage terminal VDD and a common source terminal of input transistors 310 and 312. The current source is preferably a p-channel current mirror circuit as is know in the art. A reference voltage circuit 301 is formed between the common source terminal of input transistors 310 and 312 and a common gate terminal of transistors 306 and 308. Diode 302 is coupled between the control terminal of input transistor 310 and the control terminal of transistor 306. Diode 304 is coupled between the control terminal of input transistor 312 and the control terminal of transistor 308.

Figure 3B:
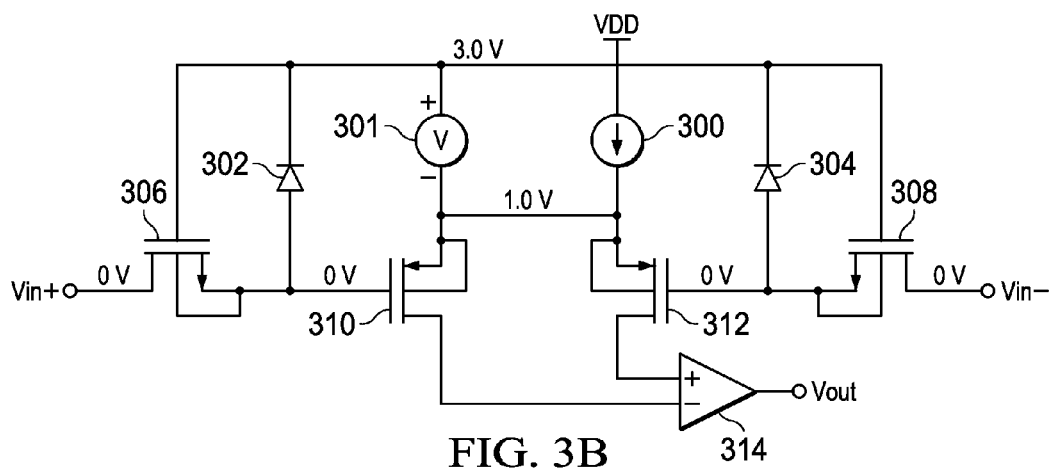
FIG. 3B shows representative voltages of the circuit diagram of FIG. 3A when differential input voltages are 0 V.
Figure 3C:
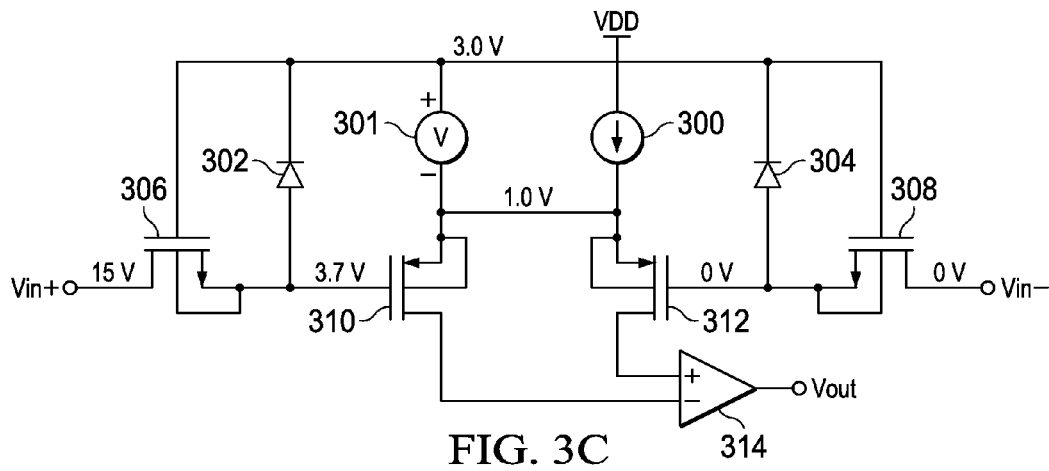
FIG. 3C shows representative voltages of the circuit diagram of FIG. 3A when differential input voltages are 15 V and 0 V.

Operation of the circuit of FIG. 3A will now be explained with reference to FIGS. 3B and 3C. FIG. 3B shows the circuit of FIG. 3A with representative voltages when differential input terminals Vin+ and Vin− are each held at 0 V. Here and in the following discussion, the internal voltages are for the purpose of explanation only and are shifted upward by the lesser of Vin+ and Vin−. For example, if Vin+ and Vin− are both 1.0 V, the control terminals of n-channel transistors 306 and 308 will be 4.0 V, and the common source terminal of input transistors 310 and 312 will be 2.0 V. Current source 300 produces 1.0 V at the common source terminal of input transistors 310 and 312. Reference voltage circuit 301 adds 2.0 V to this to produce 3.0 V at the common gate terminal of transistors 306 and 308. Transistors 306 and 308 preferably have a threshold voltage of less than 1.0 V and are both on, thereby applying the voltage at differential input terminals Vin+ and Vin− to the control terminals of input transistors 310 and 312, respectively. FIG. 3C shows the circuit of FIG. 3A with representative voltages when differential input terminals Vin+ and Vin− are held at 15 V and 0 V, respectively. This relatively high differential voltage would normally damage low voltage input transistors 310 and 312 if applied directly to their control gates. Transistor 306 charges the control terminal of input transistor 310 to approximately 3.7 V by subthreshold leakage. In this condition transistors 306 and 310 are both off. Diode 302 conducts the subthreshold leakage current through transistor 306 by to clamp the gate of transistor 310 at approximately 3.7 V. Thus, the high differential voltage advantageously turns off switching transistor 306 when it exceeds a predetermined value, thereby protecting input transistor 310.

Figure 4A:
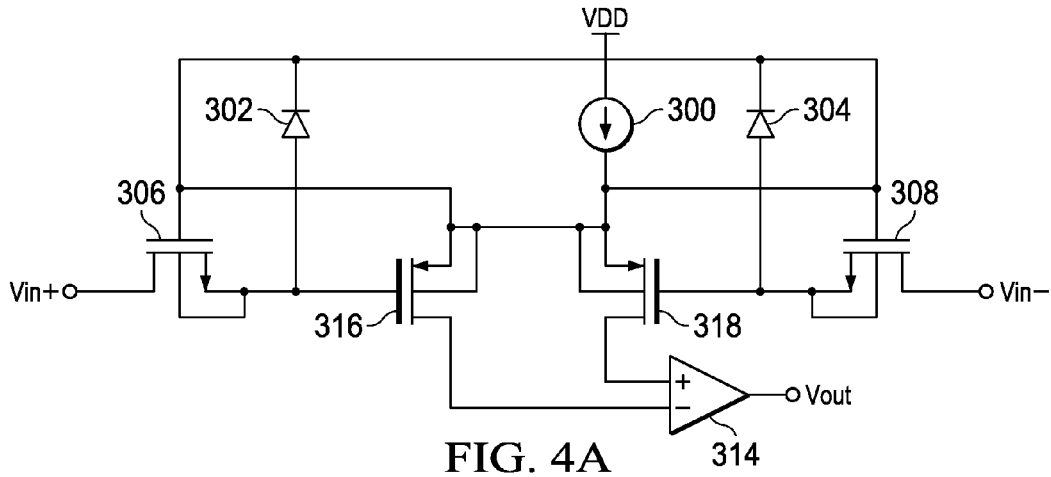
FIG. 4A is a circuit diagram of a second embodiment of a high voltage differential amplifier circuit of the present invention.

Turning now to FIG. 4A, there is a circuit diagram of a second embodiment of a high voltage differential amplifier circuit of the present invention. The circuit includes differential amplifier 314 having output terminal Vout. The differential amplifier 314 has first (−) and second (+) input terminals. A first p-channel input transistor 316 has a current path coupled to the first (−) input terminal. A second p-channel input transistor 318 has a current path coupled to the second (+) input terminal. The first and second input transistors are preferably balanced and have substantially the same threshold voltage and are oriented to compensate for any slight misalignment during fabrication. N-channel transistor 306 has a current path coupled between a first differential input terminal (Vin+) and a control terminal of the first input transistor 316. N-channel transistor 308 has a current path coupled between a second differential input terminal (Vin−) and a control terminal of the second input transistor 318. N-channel transistors 306 and 308 are preferably balanced, high voltage transistors as previously described. A current source 300 is coupled between supply voltage terminal VDD and a common source terminal of input transistors 316 and 318. The current source is preferably a p-channel current mirror circuit as is know in the art. Input transistors 316 and 318 preferably have a higher magnitude threshold voltage than transistors 306 and 308 so that reverence voltage circuit 301 (FIG. 3A) is unnecessary. The common source terminal of input transistors 316 and 318 is coupled to the common gate terminal of transistors 306 and 308. Diode 302 is coupled between the control terminal of input transistor 316 and the common gate terminal. Diode 304 is coupled between the control terminal of input transistor 318 and the common gate terminal.

Figure 4B:
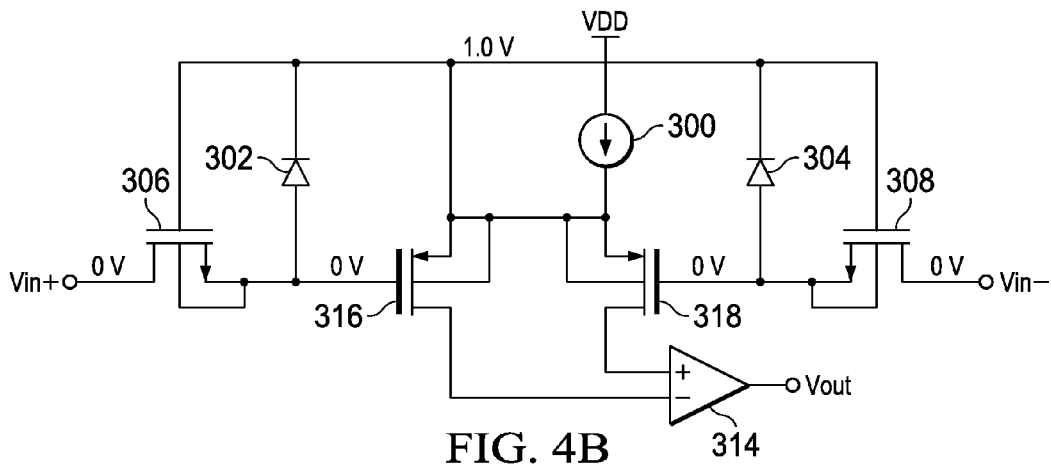
FIG. 4B shows representative voltages of the circuit diagram of FIG. 4A when differential input voltages are 0 V.
Figure 4C:
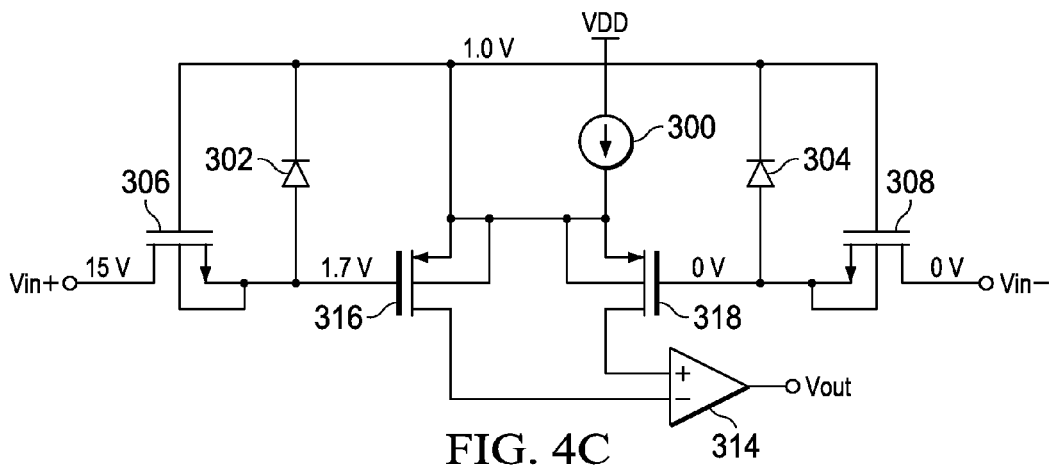
FIG. 4C shows representative voltages of the circuit diagram of FIG. 4A when differential input voltages are 15 V and 0 V.

Operation of the circuit of FIG. 4A will now be explained with reference to FIGS. 4B and 4C. FIG. 4B shows the circuit of FIG. 4A with representative voltages when differential input terminals Vin+ and Vin− are each held at 0 V. Current source 300 produces 1.0 V at the common source terminal of input transistors 316 and 318. Transistors 306 and 308 preferably have a threshold voltage of less than 1.0 V and are both on, thereby applying the voltage at differential input terminals Vin+ and Vin− to the control terminals of input transistors 316 and 318, respectively. FIG. 4C shows the circuit of FIG. 4A with representative voltages when differential input terminals Vin+ and Vin− are held at 15 V and 0 V, respectively. This relatively high differential voltage would normally damage low voltage input transistors 316 and 318 if applied directly to their control gates. Transistor 306 charges the control terminal of input transistor 310 to approximately 1.7 V by subthreshold leakage. In this condition transistors 306 and 316 are both off. Diode 302 conducts the subthreshold leakage current through transistor 306 to clamp the gate of transistor 316 at approximately 1.7 V. Thus, the high differential voltage advantageously turns off switching transistor 306 when it exceeds a predetermined value, thereby protecting input transistor 316. This embodiment of the present invention offers substantially the same advantages over high voltage differential input circuits of the prior art as the embodiment of FIG. 3A. In addition, this embodiment avoids the need for reference voltage circuit 301, thereby reducing circuit complexity.

Figure 5A:
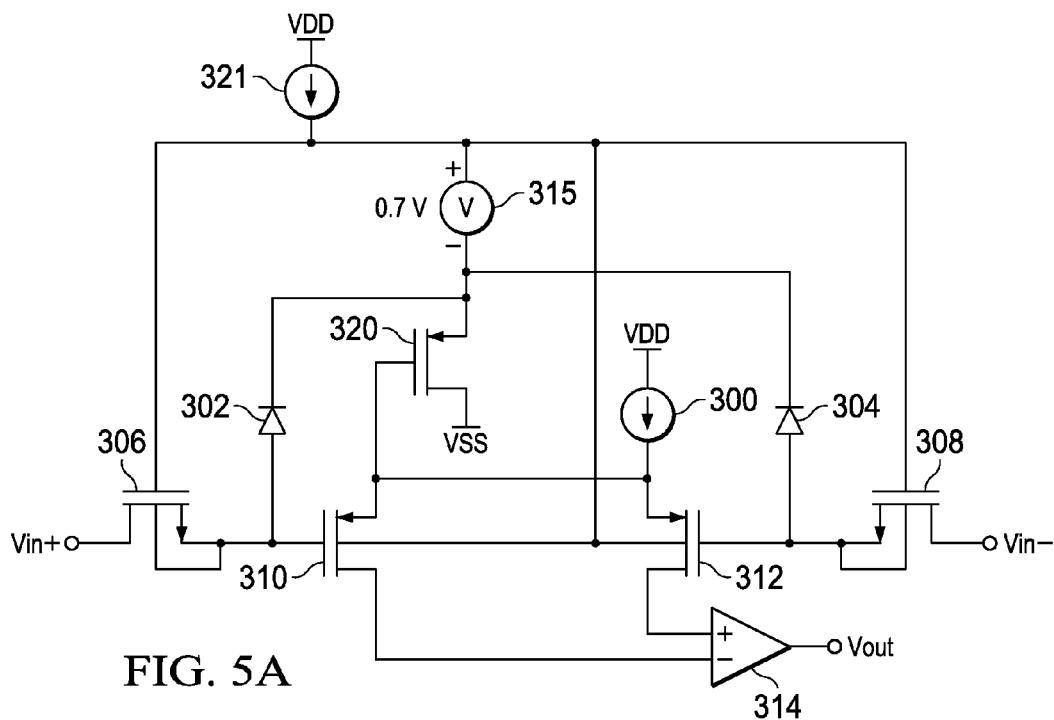
FIG. 5A is a circuit diagram of a third embodiment of a high voltage differential amplifier circuit of the present invention.

Turning now to FIG. 5A, there is a circuit diagram of a third embodiment of a high voltage differential amplifier circuit of the present invention. The circuit includes differential amplifier 314 having output terminal Vout. The differential amplifier 314 has first (−) and second (+) input terminals. A first p-channel input transistor 310 has a current path coupled to the first (−) input terminal. A second p-channel input transistor 312 has a current path coupled to the second (+) input terminal. The first and second input transistors are preferably balanced and have substantially the same threshold voltage and are oriented to compensate for any slight misalignment during fabrication. N-channel transistor 306 has a current path coupled between a first differential input terminal (Vin+) and a control terminal of the first input transistor 310. N-channel transistor 308 has a current path coupled between a second differential input terminal (Vin−) and a control terminal of the second input transistor 312. N-channel transistors 306 and 308 are preferably balanced, high voltage transistors as previously described. A current source 300 is coupled between supply voltage terminal VDD and a common source terminal of input transistors 310 and 312. The current source is preferably a p-channel current mirror circuit as is know in the art. Current source 321 is connected to supply voltage terminal VDD and provides current through reference voltage circuit 315 to the current path of p-channel transistor 320 to supply voltage terminal VSS. The control gate of transistor 320 is connected to the common source terminal of p-channel input transistors 310 and 312. Diode 302 is coupled between the control terminal of input transistor 310 and reference voltage 315. Diode 304 is coupled between the control terminal of input transistor 312 and reference voltage 315.

Figure 5B:
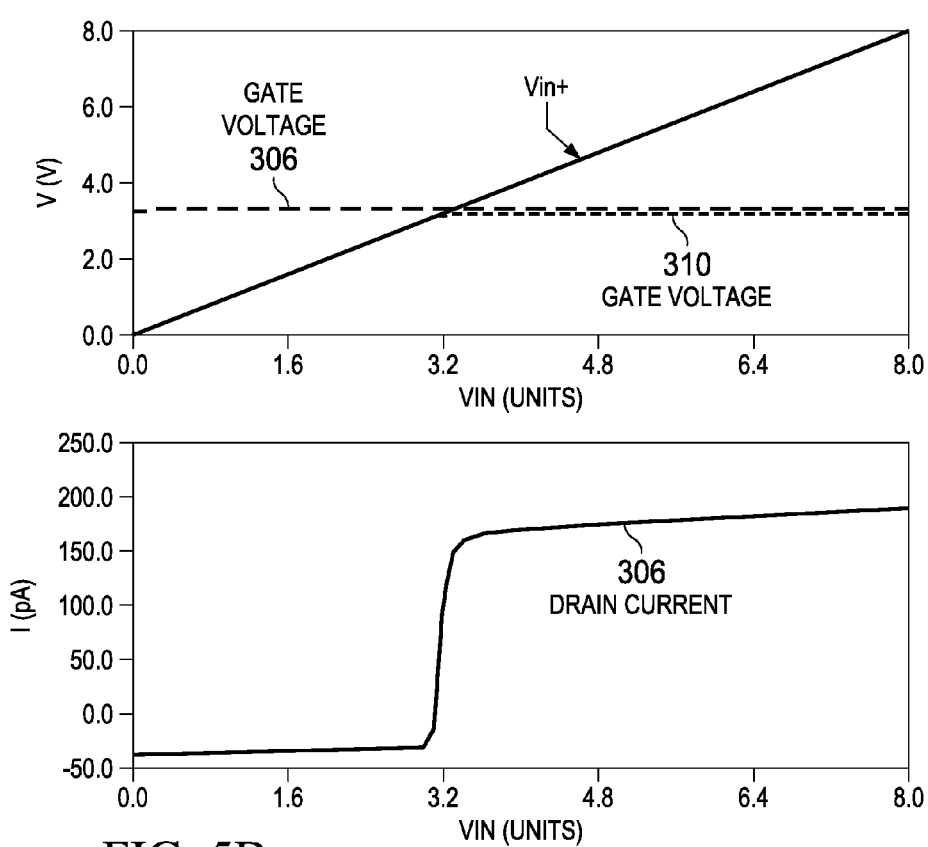
FIG. 5B is a voltage and current diagram showing operation of the circuit of FIG. 5A as input terminal Vin− is held at 0 V and input terminal Vin+ increases from 0 V to 8 V.

Referring to FIG. 5B, there is a voltage and current diagram showing operation of the circuit of FIG. 5A as input terminal Vin− is held at 0 V and input terminal Vin+ increases from 0 V to 8 V. The voltage at the gate terminal of transistor 306 is substantially constant at approximately 3.3 V as determined by current source 321 and reference voltage circuit 315. Voltage at the gate terminal of input transistor 310 follows the voltage at differential input voltage terminal Vin+ from 0 V to approximately 3.2 V. At this point, transistors 306 and 310 are both off. Subthreshold leakage current through transistor 306 increases with current through diode 302 to approximately 180 pA with little change as Vin+ increases to 8.0 V. This embodiment of the present invention offers the advantages of the previous embodiments. Additionally, current source 321 and reference voltage circuit 315 increase the gate voltage of n-channel transistors 306 and 308 to reduce their on resistance.

Still further, while numerous examples have thus been provided, one skilled in the art should recognize that various modifications, substitutions, or alterations may be made to the described embodiments while still falling within the inventive scope as defined by the following claims. For example, in the circuits of FIGS. 3A and 4A are shown with p-channel input transistors. Alternative embodiments of the present invention may include n-channel or bipolar input transistors Likewise, transistors 306 and 308 may be p-channel transistors or bipolar transistors in alternative designs. Other combinations will be readily apparent to one of ordinary skill in the art having access to the instant specification.

What is claimed is:
1. A differential input circuit, comprising:
   a first input terminal;
   a second input terminal;
   a first input transistor having a first control terminal and having a current path coupled to the first input terminal;
   a second input transistor having a second control terminal and having a current path coupled to the second input terminal;
   a third transistor having a third control terminal and having a current path between a first differential input terminal and the first control terminal;
   a fourth transistor having a fourth control terminal and having a current path between a second differential input terminal and the second control terminal; and
   a first diode coupled between the first control terminal and the third control terminal; and
   a second diode coupled between the second control terminal and the fourth control terminal.

2. The circuit of claim 1, further comprising a current source circuit coupled between a supply voltage terminal and the current paths of the first and second input transistors.

3. The circuit as in claim 1, further comprising a reference voltage circuit having a first terminal coupled to the third and fourth control terminals and having a second terminal coupled to the current paths of the first and second input transistors.

4. The circuit of claim 1, further comprising a differential amplifier having:
   an output terminal;
   a first input terminal coupled to the first terminal of the differential input circuit; and
   a second input terminal coupled to the second terminal of the differential input circuit.

5. The circuit of claim 1, wherein the third and fourth transistors are drain extended n-channel transistors.

6. The circuit of claim 1, wherein the first and second transistors are low voltage transistors and wherein the third and fourth transistors are high voltage transistors.

7. The circuit of claim 1, wherein the first and second transistors are n-channel transistors and wherein the third and fourth transistors are p-channel transistors.

8. A method of operating a differential circuit, comprising:
   applying a first input voltage to a first control terminal of a first input transistor through a current path of a first switching transistor;
   applying a second input voltage to a second control terminal of a second input transistor through a current path of a second switching transistor;
   applying a control voltage to third and fourth control terminals of the first and second switching transistors, respectively; and
   turning off, with at least one of a first diode and a second diode, at least one of the first and second switching transistors when a difference between the first and second input voltages exceeds a predetermined value, the first diode being coupled between the first control terminal and the third control terminal, and the second diode being coupled between the second control terminal and the fourth control terminal.

9. The method of claim 8, wherein the first and second input transistors are low voltage transistors and wherein the first and second switching transistors are high voltage transistors.

10. The circuit of claim 1, wherein the third control terminal is coupled to the current path of the first input transistor, and the fourth control terminal is coupled to the current path of the second input transistor.

11. A differential input circuit, comprising:
   a first terminal;
   a second terminal;
   a first input transistor having a first control terminal and having a current path formed between second and third terminals of the first input transistor, the second and third terminals of the first input transistor being different than the first control terminal, the first current path coupled to the first terminal;
   a second input transistor having a second control terminal and having a current path formed between fifth and sixth terminals of the second input transistor, the fifth and sixth terminals of the second input transistor being different than the second control terminal, the second current path coupled to the second terminal;
   a third transistor having a third control terminal coupled to the current path of the first input transistor and having a current path coupled between a first differential input terminal and the first control terminal;

a fourth transistor having a fourth control terminal coupled to the current path of the second input transistor and having a current path coupled between a second differential input terminal and the second control terminal;

a first diode coupled between the first control terminal and the third control terminal; and a second diode coupled between the second control terminal and the fourth control terminal.

12. The circuit of claim 11, further comprising a current source circuit coupled between a supply voltage terminal and the current paths of the first and second input transistors.

13. The circuit of claim 11, further comprising a differential amplifier having:

an output terminal;

a first input terminal coupled to the first terminal of the differential input circuit; and a second input terminal coupled to the second terminal of the differential input circuit.

14. The circuit of claim 11, wherein the third and fourth transistors are drain extended n-channel transistors.

15. The circuit of claim 11, wherein the first and second transistors are low voltage transistors and wherein the third and fourth transistors are high voltage transistors.

16. The circuit of claim 11, wherein the first and second transistors are n-channel transistors and wherein the third and fourth transistors are p-channel transistors.

17. The circuit of claim 11, wherein a threshold voltage of the first and second transistors is greater in magnitude than a threshold voltage of the third and fourth transistors.

18. The circuit of claim 1, wherein an anode of the first diode is coupled to the first control terminal, and a cathode of the first diode is coupled to the third control terminal, and wherein an anode of the second diode is coupled to the second control terminal, and a cathode of the second diode is coupled to the fourth control terminal.

19. The method of claim 8, wherein an anode of the first diode is coupled to the first control terminal, and a cathode of the first diode is coupled to the third control terminal, and wherein an anode of the second diode is coupled to the second control terminal, and a cathode of the second diode is coupled to the fourth control terminal.

20. The circuit of claim 11, wherein an anode of the first diode is coupled to the first control terminal, and a cathode of the first diode is coupled to the third control terminal, and wherein an anode of the second diode is coupled to the second control terminal, and a cathode of the second diode is coupled to the fourth control terminal.

* * * * *